(12) United States Patent
Gokyu et al.

(10) Patent No.: US 11,221,369 B2
(45) Date of Patent: Jan. 11, 2022

(54) CHARGE-DISCHARGE CONTROL SYSTEM FOR VEHICLE

(71) Applicant: TOYOTA JIDOSHA KABUSHIKI KAISHA, Toyota (JP)

(72) Inventors: Keiji Gokyu, Toyota (JP); Kouki Moriya, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 468 days.

(21) Appl. No.: 16/367,625

(22) Filed: Mar. 28, 2019

(65) Prior Publication Data

US 2019/0302192 A1 Oct. 3, 2019

(30) Foreign Application Priority Data

Apr. 3, 2018 (JP) .............................. JP2018-071357

(51) Int. Cl.
*H02J 7/00* (2006.01)
*G01R 31/3842* (2019.01)
(Continued)

(52) U.S. Cl.
CPC .......... *G01R 31/3842* (2019.01); *B60L 1/003* (2013.01); *B60L 50/16* (2019.02);
(Continued)

(58) Field of Classification Search
CPC ...... H02J 7/0048; H02J 7/0077; H02J 7/1415; H02J 7/1492; H02J 7/0063; H02J 7/1461; H02J 2007/0067; G01R 31/3842; G01R 19/16542; B60L 58/20; B60L 1/003; B60L 50/16; B60L 58/13; B60L 58/16; B60L 58/12; B60L 2240/547; B60L 2240/545; B60L 2210/12; B60L 2240/549;
(Continued)

(56) References Cited

U.S. PATENT DOCUMENTS

| 5,650,931 A * | 7/1997 | Nii ...................... B60L 15/2045 |
| | | 701/22 |
| 2016/0149415 A1* | 5/2016 | Ijichi ......................... H02J 3/32 |
| | | 307/66 |
| 2017/0240162 A1* | 8/2017 | Higashitani ............. B60L 58/20 |

FOREIGN PATENT DOCUMENTS

| EP | 2 453 546 A1 | 5/2012 |
| JP | H05-033691 A | 2/1993 |

(Continued)

*Primary Examiner* — Richard Isla
*Assistant Examiner* — Mohammed J Sharief
(74) *Attorney, Agent, or Firm* — Oliff PLC (57) ABSTRACT

A charge-discharge control system includes an electronic control unit. The electronic control unit is configured to: calculate an excess or shortage of a state of charge of the battery to a target state of charge as a state-of-charge difference; increase an output voltage of an electric power supply device when the shortage of the state of charge is larger than a first prescribed value; decrease the output voltage of the electric power supply device when the excess of the state of charge is larger than a second prescribed value; calculate an amount of change in the output voltage of the electric power supply device per unit time such that the amount of change in the output voltage of the electric power supply device per unit time is smaller when the calculated full charge capacity is low than when the calculated full charge capacity is high.

6 Claims, 3 Drawing Sheets

(51) Int. Cl.

| | | |
|---|---|---|
| | *B60R 16/033* | (2006.01) |
| | *G01R 19/165* | (2006.01) |
| | *H01M 10/44* | (2006.01) |
| | *H02J 7/14* | (2006.01) |
| | *B60W 20/13* | (2016.01) |
| | *B60L 58/20* | (2019.01) |
| | *B60L 1/00* | (2006.01) |
| | *B60L 50/16* | (2019.01) |
| | *B60L 58/13* | (2019.01) |
| | *B60L 58/16* | (2019.01) |
| | *B60L 58/12* | (2019.01) |

(52) U.S. Cl.
CPC ............... *B60L 58/12* (2019.02); *B60L 58/13* (2019.02); *B60L 58/16* (2019.02); *B60L 58/20* (2019.02); *B60R 16/033* (2013.01); *B60W 20/13* (2016.01); *G01R 19/16542* (2013.01); *H01M 10/441* (2013.01); *H02J 7/0063* (2013.01); *H02J 7/1461* (2013.01); *B60L 2210/12* (2013.01); *B60L 2240/545* (2013.01); *B60L 2240/547* (2013.01); *B60L 2240/549* (2013.01); *H02J 2007/0067* (2013.01)

(58) Field of Classification Search
CPC .... B60R 16/033; H01M 10/441; Y02E 60/10; Y02T 10/7072; Y02T 10/70; Y02T 10/72; Y02T 10/62; B60W 10/06; B60W 2510/244; B60W 2710/086; B60W 2710/248; B60W 10/08; B60W 10/26; B60W 20/13; B60K 6/485
USPC ......................................................... 320/132
See application file for complete search history.

(56) References Cited

FOREIGN PATENT DOCUMENTS

| | | |
|---|---|---|
| JP | 2009-055687 A | 3/2009 |
| JP | 2009-213335 A | 9/2009 |
| JP | 2010-183758 A | 8/2010 |
| JP | 2013-193618 A | 9/2013 |
| JP | 2013-542132 A | 11/2013 |
| WO | 2012/062926 A2 | 5/2012 |

\* cited by examiner

CHARGE-DISCHARGE CONTROL SYSTEM FOR VEHICLE

INCORPORATION BY REFERENCE

The disclosure of Japanese Patent Application No. 2018-071357 filed on Apr. 3, 2018 including the specification, drawings and abstract is incorporated herein by reference in its entirety.

BACKGROUND

1. Technical Field

The disclosure relates to a charge-discharge control system that is applied to a vehicle.

2. Description of Related Art

A vehicle described in Japanese Unexamined Patent Application Publication No. 2013-193618 (JP 2013-193618 A) includes a battery that supplies electric power to electrically-powered devices, such as an air conditioner, a car audio, and a navigation system. The vehicle also includes an electronic control unit (ECU) that adjusts voltage generated by an alternator. The alternator supplies electric power to the battery. The electronic control unit described in JP 2013-193618 A adjusts voltage generated by the alternator based on a comparison between a state of charge of the battery and a target state of charge.

SUMMARY

In the vehicle described in JP 2013-193618 A, when the state of charge of the battery is lower than the target state of charge, the voltage generated by the alternator is gradually increased. Therefore, when the state of charge of the battery has changed from a low state of charge to the target state of charge, the voltage generated by the alternator is properly high. Similarly, in the vehicle described in JP 2013-193618 A, when the state of charge of the battery is higher than the target state of charge, the voltage generated by the alternator is gradually decreased. Therefore, when the state of charge of the battery has changed from a high state of charge to the target state of charge, the voltage generated by the alternator is properly low. In this way, when the voltage generated by the alternator is excessively high or low at the time when the state of charge of the battery has reached the target state of charge, a phenomenon that the voltage generated by the alternator or the voltage discharged from the battery fluctuates and does not become stable, that is, so-called hunting for the generated voltage, can occur.

A charge-discharge control system according to a first aspect of the disclosure is applied to a vehicle. The vehicle includes a battery and an electric power supply device. The battery is configured to supply electric power to an electrically-powered device. The electric power supply device is configured to supply electric power to the battery and the electrically-powered device. The charge-discharge control system is configured to adjust an amount of electric power charged to or discharged from the battery. The charge-discharge control system includes an electronic control unit. The electronic control unit is configured to calculate a full charge capacity of the battery. The electronic control unit is configured to calculate an excess or shortage of a state of charge of the battery to a target state of charge as a state-of-charge difference. The electronic control unit is configured to increase an output voltage of the electric power supply device when the shortage of the state of charge is larger than a first prescribed value based on the state-of-charge difference, and decrease the output voltage of the electric power supply device when the excess of the state of charge is larger than a second prescribed value based on the state-of-charge difference. The electronic control unit is configured to calculate an amount of change in the output voltage of the electric power supply device per unit time such that the amount of change in the output voltage of the electric power supply device per unit time is smaller when the full charge capacity is low than when the full charge capacity is high.

When charge and discharge of the battery are switched, a current to the electrically-powered device rapidly varies, and hunting for the output voltage of the electric power supply device can occur accordingly. This hunting for the output voltage is severe when the state of charge of the battery is excessively higher or lower than the target state of charge. When the full charge capacity of the battery is small, the state of charge of the battery easily fluctuates even when the amount of electric power charged to the battery or the amount of electric power discharged from the battery is small, so the state of charge of the battery tends to be excessively high or excessively low accordingly.

With the above configuration, when the full charge capacity of the battery is small, the amount of change in the output voltage of the electric power supply device per unit time reduces. For this reason, an excessively high or excessively low output voltage of the electric power supply device at the time when the state of charge of the battery has reached the target state of charge is avoided. As a result, an excessively high or excessively low state of charge of the battery resulting from continuous charge or discharge of the battery although the state of charge of the battery is the target state of charge is avoided. In this way, when the output voltage of the electric power supply device at the time when the state of charge of the battery has reached the target state of charge is kept within an appropriate range, an excessively high or excessively low state of charge of the battery to the target state of charge is avoided even when the full charge capacity of the battery is small. As a result, excessively severe hunting for the output voltage of the electric power supply device due to an excessively high or excessively low state of charge of the battery is avoided.

In the charge-discharge control system, the electronic control unit may be configured to, when the shortage of the state of charge is smaller than or equal to the first prescribed value or when the excess of the state of charge is smaller than or equal to the second prescribed value, set the amount of change in the output voltage of the electric power supply device per unit time to zero. The electronic control unit may be configured to calculate at least one of the first prescribed value and the second prescribed value such that the at least one of the first prescribed value and the second prescribed value is large when the full charge capacity is low than when the full charge capacity is high.

With the above configuration, when there is a possibility that the output voltage of the electric power supply device is increased because the full charge capacity of the battery is small, a change in the output voltage of the electric power supply device is stopped in an early stage before the state of charge of the battery reaches the target state of charge. For this reason, an excessively high or excessively low output voltage of the electric power supply device at the time when the state of charge of the battery has reached the target state of charge is further appropriately avoided.

In the charge-discharge control system, the electronic control unit may be configured to calculate the amount of change in the output voltage of the electric power supply device per unit time such that the amount of change in the output voltage of the electric power supply device per unit time is smaller when an input current to the electrically-powered device is low than when the input current to the electrically-powered device is high.

When the input current to the electrically-powered device is large, a current to the electrically-powered device easily rapidly varies when charge and discharge of the battery are switched, so hunting for the output voltage of the electric power supply device can occur accordingly. As described above, this hunting for the output voltage is severe when the state of charge of the battery is excessively higher or lower than the target state of charge.

With the above configuration, when the input current to the electrically-powered device is large, the amount of change in the output voltage of the electric power supply device per unit time reduces. For this reason, an excessively high or excessively low output voltage of the electric power supply device at the time when the state of charge of the battery has reached the target state of charge is avoided. As a result, an excessively high or excessively low state of charge of the battery resulting from continuous charge or discharge of the battery although the state of charge of the battery is the target state of charge is avoided. In this way, when the state of charge of the battery is kept at a state of charge close to the target state of charge, the extent of hunting for the output voltage of the electric power supply device is decreased even when the input current to the electrically-powered device is large.

In the charge-discharge control system, the electronic control unit may be configured to, when the shortage of the state of charge is smaller than or equal to the first prescribed value or when the excess of the state of charge is smaller than or equal to the second prescribed value, set the amount of change in the output voltage of the electric power supply device per unit time to zero. The electronic control unit may be configured to calculate at least one of the first prescribed value and the second prescribed value such that the at least one of the first prescribed value and the second prescribed value is larger when the input current to the electrically-powered device is low than when the input current to the electrically-powered device is high.

With the above configuration, when there is a possibility that hunting for the output voltage of the electric power supply device becomes severe because the input current to the electrically-powered device is large, a change in the output voltage of the electric power supply device is stopped in an early stage before the state of charge of the battery reaches the target state of charge. For this reason, an excessively high or excessively low output voltage of the electric power supply device at the time when the state of charge of the battery has reached the target state of charge is further appropriately avoided.

A charge-discharge control system according to a second aspect of the disclosure is applied to a vehicle. The vehicle includes a battery and an electric power supply device. The battery is configured to supply electric power to an electrically-powered device. The electric power supply device is configured to supply electric power to the battery and the electrically-powered device. The charge-discharge control system is configured to adjust an amount of electric power charged to or discharged from the battery. The charge-discharge control system includes an electronic control unit. The electronic control unit is configured to calculate an excess or shortage of a state of charge of the battery to a target state of charge as a state-of-charge difference. The electronic control unit is configured to set a target input current of an input current to the battery based on the state-of-charge difference. The electronic control unit is configured to adjust an output voltage of the electric power supply device based on the input current to the battery and the target input current. The electronic control unit is configured to set the target input current to a positive value when the shortage of the state of charge is larger than a first prescribed value. The electronic control unit is configured to set the target input current to a negative value when the excess of the state of charge is larger than a second prescribed value. The electronic control unit is configured to calculate an amount of change in the output voltage of the electric power supply device per unit time such that the amount of change in the output voltage of the electric power supply device per unit time is smaller when a difference between the input current to the battery and the target input current is small than when the difference between the input current to the battery and the target input current is large.

With the above configuration, the target input current of the input current to the battery is set based on an excess or shortage of the state-of-charge difference, and the amount of change in the output voltage of the electric power supply device is set based on the difference between the input current to the battery and the target input current. The input current to the battery has good trackability to a change in the output voltage of the electric power supply device and quickly varies as compared to the state of charge of the battery. For this reason, a continuous increase or continuous decrease in the output voltage of the electric power supply device due to long-term difference between the input current to the battery and the target input current is avoided. As a result, an excessively high or excessively low output voltage of the electric power supply device at the time when the state of charge of the battery has reached the target state of charge is avoided.

In the charge-discharge control system, a minimum value of each of the first prescribed value and the second prescribed value may be zero. In the above configuration, when the output voltage of the electric power supply device at the time when the state of charge of the battery has reached the target state of charge is desired to be kept within an appropriate range, the first prescribed value or the second prescribed value is desirably a large value. On the other hand, if the first prescribed value or the second prescribed value is a large value, there are an increased number of situations in which the output voltage of the electric power supply device does not vary, so a period of time that is taken until the state of charge of the battery reaches the target state of charge may extend. As in the case of the above-described aspects, a configuration that sets the minimum values of the first prescribed value and second prescribed value to zero is preferably employed on the assumption of a configuration that is able to decrease the extent of hunting for the output voltage of the electric power supply device, in terms of quickly adjusting the state of charge of the battery to the target state of charge while avoiding excessive hunting.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

First Embodiment

A first embodiment in which the disclosure is applied to a vehicle including a hybrid system will be described. First, the schematic configuration of the hybrid system of the first embodiment will be described.

Figure 1:
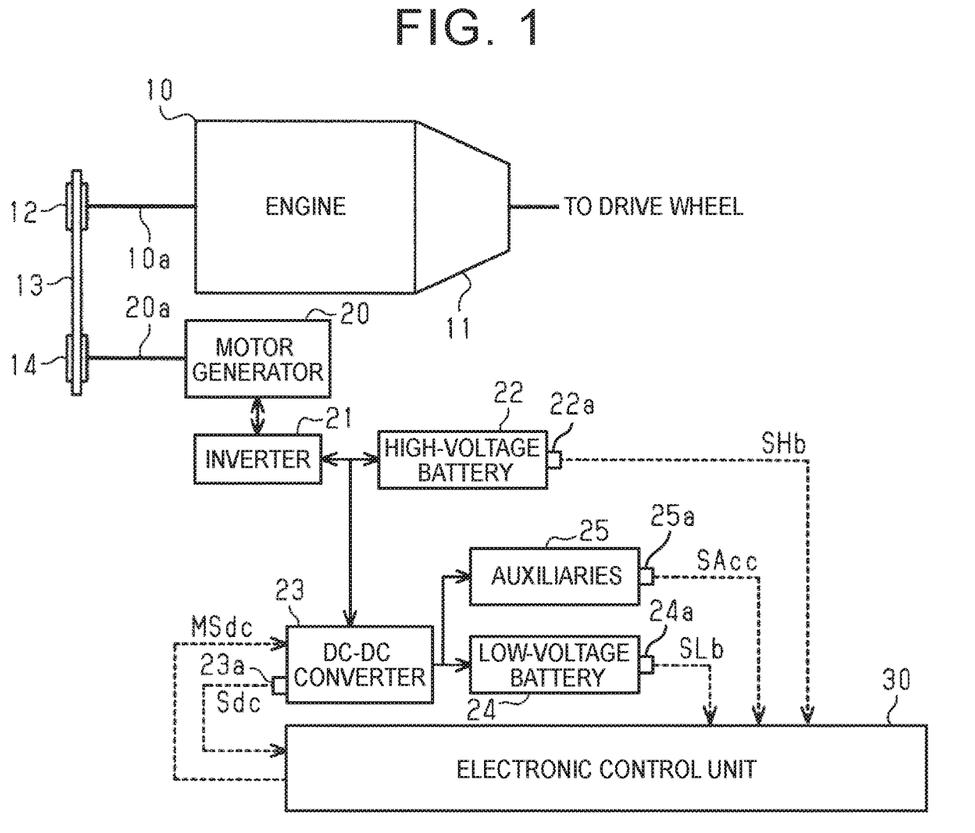
FIG. 1 is a schematic configuration diagram of a hybrid system.

As shown in FIG. 1, the hybrid system includes an engine 10 as a driving source of the vehicle. A crankshaft 10a of the engine 10 is coupled to a drive wheel via a transmission 11 and other devices so as to drive the drive wheel. The crankshaft 10a of the engine 10 is also coupled to a first pulley 12 so as to drive the first pulley 12. A transmission belt 13 is wound around the first pulley 12. Although not shown in the drawing, the crankshaft 10a of the engine 10 is further coupled to a hydraulic pump for generating hydraulic pressure, a compressor of an air conditioner, and other devices via a belt, a pulley, a gear (sprocket), a chain, or other components so as to drive the hydraulic pump, the compressor, and other devices.

The hybrid system includes a motor generator 20 as a driving source other than the engine 10. The motor generator 20 is a so-called three-phase alternating-current motor. An output shaft 20a of the motor generator 20 is coupled to a second pulley 14 so as to drive the second pulley 14. The transmission belt 13 is wound around the second pulley 14. That is, the motor generator 20 is coupled to the crankshaft 10a of the engine 10 via the second pulley 14, the transmission belt 13, and the first pulley 12 so as to drive the crankshaft 10a.

When the motor generator 20 operates as an electric motor, the motor generator 20 supplies torque to the second pulley 14. The torque is input to the crankshaft 10a of the engine 10 via the transmission belt 13 and the first pulley 12. That is, in this case, the motor generator 20 assists the engine 10. On the other hand, when the motor generator 20 operates as a generator, the torque of the crankshaft 10a of the engine 10 is input to the output shaft 20a of the motor generator 20 via the first pulley 12, the transmission belt 13, and the second pulley 14. The motor generator 20 generates electric power commensurate with the rotation of the output shaft 20a.

A high-voltage battery 22 is connected to the motor generator 20 via an inverter 21. The inverter 21 is a so-called bidirectional inverter. The inverter 21 converts alternating-current voltage generated by the motor generator 20 to direct-current voltage and outputs the direct-current voltage to the high-voltage battery 22. The inverter 21 also converts direct-current voltage output from the high-voltage battery 22 to alternating-current voltage and outputs the alternating-current voltage to the motor generator 20. In FIG. 1, the inverter 21 is shown separately from the motor generator 20; however, the inverter 21 can be incorporated inside a housing of the motor generator 20.

The high-voltage battery 22 is a lithium ion battery. When the motor generator 20 operates as an electric motor, the high-voltage battery 22 supplies electric power to the motor generator 20. When the motor generator 20 operates as a generator, the high-voltage battery 22 is charged with electric power supplied from the motor generator 20.

A sensor unit 22a is incorporated in the high-voltage battery 22. The sensor unit 22a detects the status of the high-voltage battery 22. The sensor unit 22a detects the voltage between the terminals, input current, temperature, and the like, of the high-voltage battery 22, and outputs these detection results as a signal that represents status information SHb about the high-voltage battery 22.

A DC-DC converter 23 is connected to the motor generator 20 via the inverter 21. The DC-DC converter 23 is also connected to the high-voltage battery 22. The DC-DC converter 23 steps down direct-current voltage that is output from the inverter 21 or the high-voltage battery 22, to a voltage of 10 V to 15 V, and outputs the stepped-down direct-current voltage. A sensor unit 23a is incorporated in the DC-DC converter 23. The sensor unit 23a detects the status of the DC-DC converter 23. The sensor unit 23a detects the output voltage, output current, and the like, of the DC-DC converter 23, and outputs these detection results as a signal that represents status information Sdc about the DC-DC converter 23.

A low-voltage battery 24 is connected to the DC-DC converter 23. The low-voltage battery 24 is a 12 V lead storage battery lower in voltage than the high-voltage battery 22. When the DC-DC converter 23 is not driven or when the output voltage of the DC-DC converter 23 is 12 V, the low-voltage battery 24 outputs a direct-current voltage of 12 V. When the output voltage of the DC-DC converter 23 is higher than the open circuit voltage (OCV) of the low-voltage battery 24, the low-voltage battery 24 is charged with electric power supplied from the DC-DC converter 23. That is, the DC-DC converter 23 operates as an electric power supply device for the low-voltage battery 24.

A sensor unit 24a is incorporated in the low-voltage battery 24. The sensor unit 24a detects the status of the low-voltage battery 24. The sensor unit 24a detects the voltage between the terminals, input current, temperature, and the like, of the low-voltage battery 24, and outputs these detection results as a signal that represents status information SLb about the low-voltage battery 24.

Various auxiliaries 25 are connected to the DC-DC converter 23 and the low-voltage battery 24 as electrically-powered devices. Examples of the auxiliaries 25 include lighting equipment, such as headlamps, direction indicator lamps and room lamp of the vehicle, and vehicle interior equipment, such as a car navigation system and speakers. When the DC-DC converter 23 is not driven, the auxiliaries 25 are supplied with electric power from the low-voltage battery 24. When the output voltage of the DC-DC converter 23 is higher than the open circuit voltage (OCV) of the low-voltage battery 24, the auxiliaries 25 are supplied with electric power from the DC-DC converter 23. That is, the DC-DC converter 23 operates as an electric power supply device for the auxiliaries 25.

A sensor unit 25a is incorporated in each of the auxiliaries 25, and detects the status of a corresponding one of the auxiliaries 25. Each of the sensor units 25a detects the voltage between the terminals, input current, temperature, and the like, of a corresponding one of the auxiliaries 25, and outputs these detection results as a signal that represents status information SAcc about the corresponding one of the auxiliaries 25.

As shown in FIG. 1, the hybrid system includes an electronic control unit 30. The electronic control unit 30 generally controls the entire operation of the hybrid system, including charge and discharge of the low-voltage battery 24. That is, a charge-discharge control system includes the electronic control unit 30. The electronic control unit 30 is a processing circuit (computer) including an operation unit, a nonvolatile storage unit, a volatile memory, and other components. The operation unit executes various programs (applications). Programs, and the like, are stored in the nonvolatile storage unit. Data are temporarily stored in the volatile memory when the programs are executed.

The signal that represents the status information Sdc is input from the sensor unit 23a of the DC-DC converter 23 to the electronic control unit 30. Based on this signal, the electronic control unit 30 learns the output voltage Vout, output current, and the like, of the DC-DC converter 23. The signal that represents the status information SAcc is input from the sensor unit 25a of each of the auxiliaries 25 to the electronic control unit 30. Based on these signals, the electronic control unit 30 calculates the sum of currents that are input to the auxiliaries 25 as an input current Iacc to the auxiliaries 25.

The signal that represents the status information SLb is input from the sensor unit 24a of the low-voltage battery 24 to the electronic control unit 30. The electronic control unit 30 calculates a full charge capacity SOCmax and state of charge SOC of the low-voltage battery 24 based on the information, such as the voltage between the terminals, input current, and temperature, of the low-voltage battery 24, included in the status information SLb. In this embodiment, the full charge capacity SOCmax of the low-voltage battery 24 is a maximum amount of charge to which the low-voltage battery 24 is allowed to be charged at the time when the status information SLb is input, and is represented by, for example, ampere hour (Ah). The state of charge SOC is the proportion of an amount of charge in the low-voltage battery 24 at the time when the status information SLb is input to the full charge capacity SOCmax of the low-voltage battery 24, and is represented by, for example, percentage (%). In this way, the electronic control unit 30 is configured to calculate the full charge capacity SOCmax of the low-voltage battery 24.

The electronic control unit 30 is configured to calculate an excess or shortage of the state of charge SOC, calculated as described above, of the low-voltage battery 24 to a target state of charge SOCtg as a state-of-charge difference ΔSOC. The target state of charge SOCtg is stored in advance in the storage unit of the electronic control unit 30, and is determined within, for example, the range of 80% to 90%.

The signal that represents the status information SLb is input from the sensor unit 22a of the high-voltage battery 22 to the electronic control unit 30. The electronic control unit 30, as in the case of the above-described low-voltage battery 24, calculates a full charge capacity of the high-voltage battery 22 and a state of charge of the high-voltage battery 22 to the full charge capacity.

The electronic control unit 30 is configured to adjust the output voltage Vout of the DC-DC converter 23 based on the state-of-charge difference ΔSOC calculated as described above.

Figure 2:
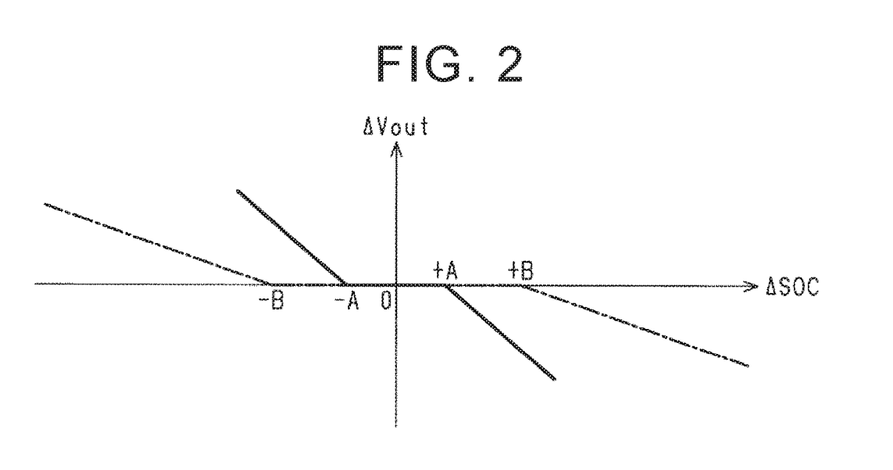
FIG. 2 is a graph that shows the relationship between an excess or shortage of a state of charge of a battery to a target state of charge of the battery and an amount of change in output voltage of a DC-DC converter in a first embodiment.

A voltage control map (relational expression) is stored in the storage unit of the electronic control unit 30. The voltage control map is used to adjust the output voltage Vout of the DC-DC converter 23. As shown in FIG. 2, in this voltage control map, the relationship between a state-of-charge difference ΔSOC and an amount of change ΔVout in the output voltage Vout of the DC-DC converter 23 per unit time (per control period) is set. Specifically, as represented by the solid line in FIG. 2, within the range in which the state-of-charge difference ΔSOC is larger than or equal to −A and smaller than or equal to +A, the amount of change ΔVout in output voltage Vout is zero. When the state-of-charge difference ΔSOC is smaller than −A, in other words, when a shortage of the state of charge SOC is larger than A that is a first prescribed value, the amount of change ΔVout in the output voltage Vout is a positive value. As the shortage increases (as the state-of-charge difference ΔSOC shifts leftward in FIG. 2), the amount of change ΔVout in the output voltage Vout increases. On the other hand, when the state-of-charge difference ΔSOC is larger than +A, in other words, when an excess of the state of charge SOC is larger than A that is a second prescribed value, the amount of change ΔVout in the output voltage Vout is a negative value. As the excess increases (as the state-of-charge difference ΔSOC shifts rightward in FIG. 2), the amount of change ΔVout in the output voltage Vout reduces. "A" that is each of the first prescribed value and the second prescribed value is determined in advance, and is, for example, several percent.

Next, a charge-discharge control process that the electronic control unit 30 in the hybrid system of the first embodiment executes will be described. The charge-discharge control process is repeatedly executed at intervals of a predetermined control period from when an ignition switch (which may also be referred to as system start-up switch, a start switch, or the like) for the engine is turned on to activate the hybrid system to when the hybrid system is deactivated.

Figure 3:
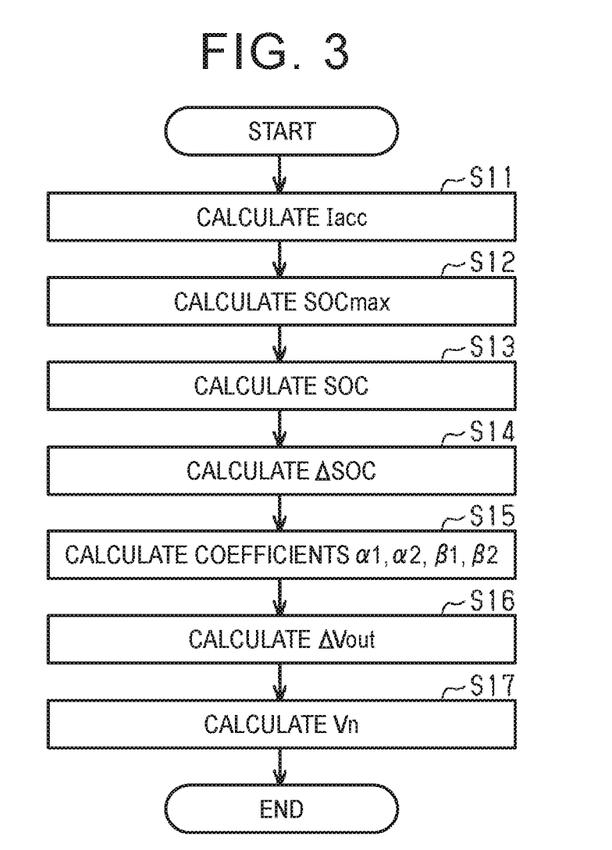
FIG. 3 is a flowchart of a charge-discharge control process in the first embodiment.

As shown in FIG. 3, as the charge-discharge control process is started, the electronic control unit 30 executes the process of step S11. In step S11, the electronic control unit 30 calculates the input current Iacc to the auxiliaries 25 based on the pieces of status information SAcc about the auxiliaries 25. After that, the process of the electronic control unit 30 proceeds to step S12.

In step S12, the electronic control unit 30 calculates the full charge capacity SOCmax of the low-voltage battery 24 based on the status information SLb about the low-voltage battery 24. Specifically, the electronic control unit 30 calculates the full charge capacity SOCmax such that the full charge capacity SOCmax reduces as the temperature of the low-voltage battery 24 decreases. The electronic control unit 30 calculates the full charge capacity SOCmax such that the full charge capacity SOCmax reduces as an integrated value of charge current and discharge current from when the low-voltage battery 24 has been manufactured increases. After the electronic control unit 30 calculates the full charge capacity SOCmax, the process of the electronic control unit 30 proceeds to step S13.

In step S13, the electronic control unit 30 calculates the state of charge SOC of the low-voltage battery 24 based on the status information SLb about the low-voltage battery 24. Specifically, the electronic control unit 30 calculates the state of charge SOC to the full charge capacity SOCmax calculated in step S12 based on an integrated value of charge current of the low-voltage battery 24 and an integrated value of discharge current of the low-voltage battery 24. After that, the process of the electronic control unit 30 proceeds to step S14.

In step S14, the electronic control unit 30 calculates the state-of-charge difference ΔSOC by subtracting the target state of charge SOCtg from the state of charge SOC calculated in step S13. Therefore, in this embodiment, a shortage of the state of charge SOC to the target state of charge SOCtg is calculated as a negative state-of-charge difference ΔSOC, and an excess of the state of charge SOC to the target state of charge SOCtg is calculated as a positive state-of-charge difference ΔSOC. After calculation of the state-of-charge difference ΔSOC, the process of the electronic control unit 30 proceeds to step S15.

in step S15, the electronic control unit 30 calculates a coefficient α1 and a coefficient α2 for calculating the amount of change ΔVout in the output voltage Vout of the DC-DC converter 23. The coefficient α1 and the coefficient α2 each are a positive value smaller than or equal to one. The electronic control unit 30 calculates the coefficient α1 such that the coefficient α1 reduces as the input current Iacc to the auxiliaries 25, calculated in step S11, increases. The electronic control unit 30 calculates the coefficient α2 such that the coefficient α2 reduces as the full charge capacity SOCmax of the low-voltage battery 24, calculated in step S12, reduces. On the other hand, a coefficient β1 and a coefficient β2 each are a value larger than or equal to one. The electronic control unit 30 calculates the coefficient β1 such that the coefficient β1 increases as the input current Iacc to the auxiliaries 25, calculated in step S11, increases. The electronic control unit 30 calculates the coefficient β2 such that the coefficient β2 increases as the full charge capacity SOCmax of the low-voltage battery 24, calculated in step S12, reduces. After these coefficients are calculated, the process of the electronic control unit 30 proceeds to step S16.

In step S16, the electronic control unit 30 calculates the amount of change ΔVout in the output voltage Vout of the DC-DC converter 23 based on the voltage control map (see FIG. 2) stored in the storage unit and the coefficient α1, the coefficient α2, the coefficient β1, and the coefficient β2, calculated in step S15.

Specifically, the electronic control unit 30 multiplies the rate of change (the slope of the straight line in FIG. 2) in the amount of change ΔVout to the state-of-charge difference ΔSOC in the voltage control map by the coefficient α1 and the coefficient α2. As described above, the coefficient α1 and the coefficient α2 each are a positive value smaller than or equal to one. Therefore, the rate of change in the amount of change ΔVout, newly calculated in step S16, to the state-of-charge difference ΔSOC is smaller than the rate of change in the voltage control map stored in the storage unit (the slope of the straight line becomes gentler). The electronic control unit 30 calculates a new first prescribed value B (second prescribed value B) by multiplying the first prescribed value A (second prescribed value A) in the voltage control map by the coefficient β1 and the coefficient β2. As described above, the coefficient β1 and the coefficient β2 each are a value larger than or equal to one. Therefore, the first prescribed value B that is newly calculated in step S16 is larger than the first prescribed value A in the voltage control map. In this way, a map (relational expression) between a state-of-charge difference ΔSOC and an amount of change ΔVout is newly calculated. The electronic control unit 30 calculates the amount of change ΔVout in the output voltage Vout by substituting the state-of-charge difference ΔSOC calculated in step S14 into the calculated map (relational expression). After that, the process of the electronic control unit 30 proceeds to step S17.

In step S17, the electronic control unit 30 calculates a new target voltage Vn of the output voltage Vout of the DC-DC converter 23 by adding the amount of change ΔVout calculated in step S16 to a target voltage Vn−1 calculated in the last control cycle. In the first control cycle after the hybrid system is activated, the last target voltage Vn−1 is treated as a predetermined initial value (for example, the open circuit voltage of the low-voltage battery 24). The electronic control unit 30 outputs an operation signal MSdc commensurate with the calculated target voltage Vn to the DC-DC converter 23. After the electronic control unit 30 outputs the operation signal MSdc, one cycle of the charge-discharge control process by the electronic control unit 30 ends, and step S11 is executed again after a predetermined control period.

The operation and advantageous effects of the first embodiment will be described. First, for comparison purposes, an example in which the process of step S15, and other steps, in the charge-discharge control process are not executed and the amount of change ΔVout in the output voltage Vout of the DC-DC converter 23 is calculated as shown by the voltage control map represented by the solid line in FIG. 2 will be described.

In the hybrid system, it is assumed that the state of charge SOC of the low-voltage battery 24 is lower than the target state of charge SOCtg and a shortage of the state of charge SOC is larger than the first prescribed value A. That is, it is assumed that, in the graph shown in FIG. 2, the state-of-charge difference ΔSOC is smaller than −A. In this case, the amount of change ΔVout is calculated as a positive value. Therefore, before the difference between the state of charge SOC of the low-voltage battery 24 and the target state of charge SOCtg becomes smaller than or equal to the first prescribed value A, the output voltage Vout (target voltage Vn) of the DC-DC converter 23 continues to increase. After the difference between the state of charge SOC of the low-voltage battery 24 and the target state of charge SOCtg becomes smaller than or equal to the first prescribed value A, an increase in the output voltage Vout of the DC-DC converter 23 stops, the output voltage Vout is kept at a constant value, and the output voltage Vout does not decrease. Therefore, when the state of charge SOC of the low-voltage battery 24 has reached the target state of charge SOCtg, the output voltage Vout of the DC-DC converter 23 is property high.

After the state of charge SOC of the low-voltage battery 24 has reached the target state of charge SOCtg, as the state of charge SOC of the low-voltage battery 24 becomes higher than the target state of charge SOCtg and an excess of the state of charge SOC becomes larger than the second prescribed value A, the output voltage Vout of the DC-DC converter 23 starts decreasing. Then, as the output voltage Vout of the DC-DC converter 23 becomes lower than the open circuit voltage of the low-voltage battery 24, the low-voltage battery 24 starts discharging electric power, and the state of charge SOC of the low-voltage battery 24 starts decreasing. In this way, even when the state of charge SOC of the low-voltage battery 24 has reached the target state of charge SOCtg, charge of the low-voltage battery 24 is continued until the output voltage Vout of the DC-DC converter 23 reaches the open circuit voltage of the low-voltage battery 24, with the result that the state of charge SOC of the low-voltage battery 24 exceeds the target state of charge SOCtg.

When the input current Iacc to the auxiliaries 25 is large, current rapidly flows to the auxiliaries 25 when discharge of the low-voltage battery 24 has been started, and hunting for the discharge voltage of the low-voltage battery 24 or the output voltage Vout of the DC-DC converter 23 can occur accordingly. This voltage hunting becomes severer as the state of charge SOC of the low-voltage battery 24 increases. For this reason, when the condition that the input current Iacc to the auxiliaries 25 is large and the condition that the state of charge SOC at the start of discharge of the low-voltage battery 24 is high are satisfied at the same time, voltage hunting is not ignorable.

In terms of this point, in the first embodiment, when the input current Iacc to the auxiliaries 25 is large, the rate of change in the amount of change ΔVout to the state-of-charge difference ΔSOC decreases as represented by the alternate long and short dashes line in FIG. 2, with the result that the amount of change ΔVout in the output voltage Vout of the DC-DC converter 23 per unit time reduces. Therefore, the amount of increase in the output voltage Vout of the DC-DC converter 23 from when the state of charge SOC of the low-voltage battery 24 is low to when the state of charge SOC reaches the target state of charge SOCtg is reduced as compared to the above-described example. As a result, an excessive increase in the state of charge SOC at the start of discharge of the low-voltage battery 24 resulting from continuous charge of the low-voltage battery 24 although the state of charge SOC of the low-voltage battery 24 has reached the target state of charge SOCtg is avoided. That is, in the first embodiment, under the situation in which voltage hunting easily occurs, that is, the input current Iacc to the auxiliaries 25 is large, the extent of voltage hunting is minimized by making it difficult to satisfy the condition that the state of charge SOC of the low-voltage battery 24 is higher than the target state of charge SOCtg where voltage hunting similarly easily occurs.

On the other hand, when there is aged degradation, or the like, in the low-voltage battery 24 and the full charge capacity SOCmax of the low-voltage battery 24 is small, the state of charge SOC to the full charge capacity SOCmax of the low-voltage battery 24 easily becomes high even when the amount of electric power that is supplied to the low-voltage battery 24 is the same. For this reason, if charge is continued after the state of charge SOC of the low-voltage battery 24 exceeds the target state of charge SOCtg as described above, the state of charge SOC of the low-voltage battery 24 easily becomes excessively high, so the extent of voltage hunting also easily becomes severe accordingly.

In the first embodiment, when the full charge capacity SOCmax of the low-voltage battery 24 is small, the rate of change in the amount of change ΔVout to the state-of-charge difference ΔSOC decreases as represented by the alternate long and short dashes line in FIG. 2, so the amount of change ΔVout in the output voltage Vout of the DC-DC converter 23 per unit time reduces. Therefore, the amount of increase in the output voltage Vout of the DC-DC converter 23 from when the state of charge SOC of the low-voltage battery 24 is low to when the state of charge SOC reaches the target state of charge SOCtg is reduced. As a result, an excessive increase in the state of charge SOC at the start of discharge of the low-voltage battery 24 resulting from continuous charge of the low-voltage battery 24 although the state of charge SOC of the low-voltage battery 24 has reached the target state of charge SOCtg is avoided. That is, in the first embodiment, under the situation in which voltage hunting easily occurs, that is, the full charge capacity SOCmax of the low-voltage battery 24 is small, the extent of voltage hunting is minimized by making it difficult to satisfy the condition that the state of charge SOC of the low-voltage battery 24 is higher than the target state of charge SOCtg where voltage hunting similarly easily occurs.

In the first embodiment, when the input current Iacc to the auxiliaries 25 is large or when the full charge capacity SOCmax of the low-voltage battery 24 is small, that is, when the extent of voltage hunting can become severe, the first prescribed value A is replaced with the larger first prescribed value B as shown in FIG. 2. Therefore, the amount of change ΔVout in the output voltage Vout of the DC-DC converter 23 becomes zero in an early stage before the state of charge SOC of the low-voltage battery 24 reaches the target state of charge SOCtg, and the output voltage Vout of the DC-DC converter 23 becomes constant. For this reason, the output voltage Vout of the DC-DC converter 23 at the time when the state of charge SOC of the low-voltage battery 24 has reached the target state of charge SOCtg is decreased to a lower voltage.

The case where the low-voltage battery 24 is charged from when the state of charge SOC of the low-voltage battery 24 is lower than the target state of charge SOCtg is described above as an example. Similar advantageous effects are also obtained in the case where the low-voltage battery 24 is discharged from when the state of charge SOC of the low-voltage battery 24 is higher than the target state of charge SOCtg.

Second Embodiment

A second embodiment in which the disclosure is applied to a vehicle including a hybrid system will be described. The schematic configuration of the hybrid system in the second embodiment is similar to that of the first embodiment (see FIG. 1), so the description of overlapping portions will be simplified or omitted.

The electronic control unit 30 in the hybrid system of the second embodiment, as in the case of the above-described first embodiment, is configured to calculate an excess or shortage to the target state of charge SOCtg as a state-of-charge difference ΔSOC and adjust the output voltage Vout of the DC-DC converter 23. The electronic control unit 30 is configured to calculate a battery input current Ibat to the low-voltage battery 24 based on the status information SLb that is input from the sensor unit 24a of the low-voltage battery 24. The electronic control unit 30 is configured to set a target input current Itg of the battery input current Ibat to the low-voltage battery 24 based on the state-of-charge difference ΔSOC.

Figure 4:
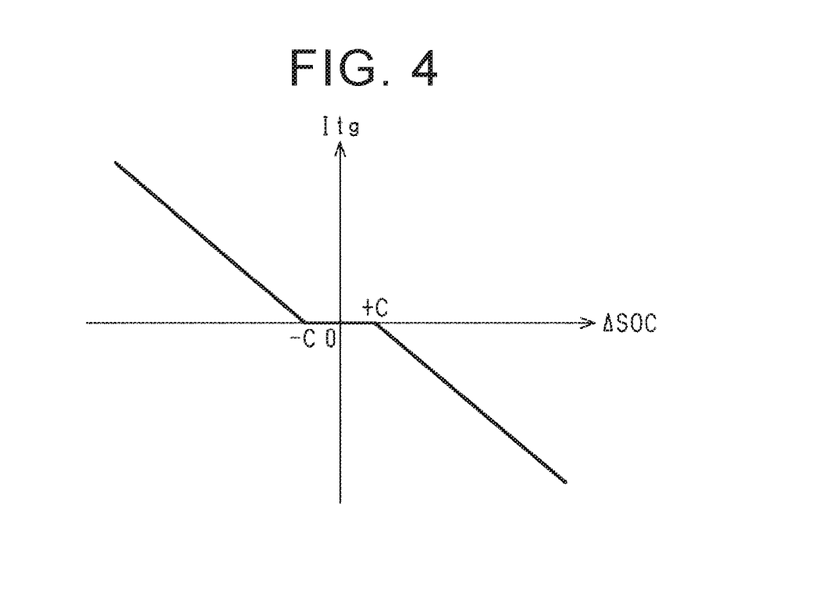
FIG. 4 is a graph that shows the relationship between an excess or shortage of a state of charge of a battery to a target state of charge of the battery and a target input current of auxiliaries in a second embodiment.

A voltage control map (relational expression) that is used to adjust the output voltage Vout of the DC-DC converter 23 is stored in the storage unit of the electronic control unit 30. As shown in FIG. 4, in this voltage control map, the relationship between a state-of-charge difference ΔSOC and a target input current Itg to the low-voltage battery 24 is set. Specifically, as represented by the solid line in FIG. 4, within the range in which the state-of-charge difference ΔSOC is larger than or equal to −C and smaller than or equal to +C, the target input current Itg is zero. When the state-of-charge difference ΔSOC is smaller than −C, in other words, when a shortage of the state of charge SOC is larger than C that is a first prescribed value, the target input current Itg is a positive value. As the shortage increases (as the state-of-charge difference ΔSOC shifts leftward in FIG. 4), the target input current Itg increases. On the other hand, when the state-of-charge difference ΔSOC is larger than +C, in other words, when an excess of the state of charge SOC is larger than C that is a second prescribed value, the target input current Itg is a negative value. As the excess increases (as the state-of-charge difference ΔSOC shifts rightward in FIG. 4), the target input current Itg reduces. When the target input current Itg (battery input current) is a negative value, it means that current is output from the low-voltage battery 24. "C" that is each of the first prescribed value and the second prescribed value is determined in advance, and is, for example, smaller than one percent.

Next, a charge-discharge control process that the electronic control unit 30 in the hybrid system of the second embodiment executes will be described. The charge-discharge control process is repeatedly executed at intervals of a predetermined control period from when the ignition switch for the engine is turned on to activate the hybrid system to when the hybrid system is deactivated.

Figure 5:
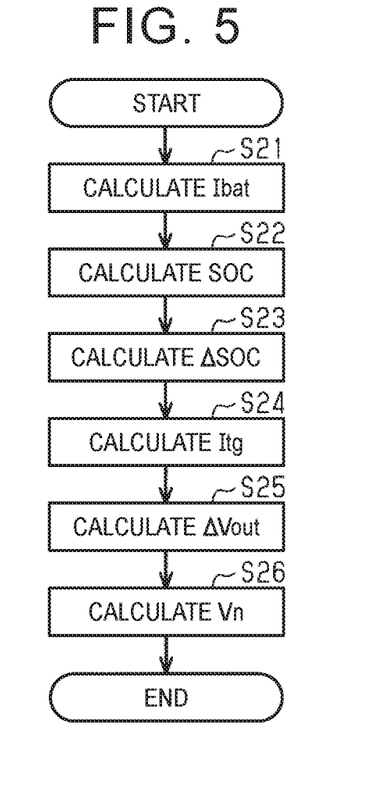
FIG. 5 is a flowchart of a charge-discharge control process in the second embodiment.

As shown in FIG. 5, as the charge-discharge control process is started, the electronic control unit 30 executes the process of step S21. In step S21, the electronic control unit 30 calculates the battery input current Ibat to the low-voltage battery 24 based on the status information SLb about the low-voltage battery 24. After that, the process of the electronic control unit 30 proceeds to step S22.

In step S22, the electronic control unit 30 calculates the state of charge SOC of the low-voltage battery 24 based on the status information SLb about the low-voltage battery 24. Specifically, the electronic control unit 30 calculates the full charge capacity SOCmax based on the temperature of the low-voltage battery 24, and an integrated value of charge current and discharge current from when the low-voltage battery 24 is manufactured. The electronic control unit 30 calculates the state of charge SOC to the full charge capacity SOCmax based on the integrated value of charge current to the low-voltage battery 24 and the integrated value of discharge current from the low-voltage battery 24. After that, the process of the electronic control unit 30 proceeds to step S23.

In step S23, the electronic control unit 30 calculates the state-of-charge difference ΔSOC by subtracting the target state of charge SOCtg from the state of charge SOC calculated in step S22. Therefore, in this embodiment, a shortage of the state of charge SOC to the target state of charge SOCtg is calculated as a negative state-of-charge difference ΔSOC, and an excess of the state of charge SOC to the target state of charge SOCtg is calculated as a positive state-of-charge difference ΔSOC. After calculation of the state-of-charge difference ΔSOC, the process of the electronic control unit 30 proceeds to step S24.

In step S24, the electronic control unit 30 calculates the target input current Itg by substituting the state-of-charge difference ΔSOC calculated in step S23 into the voltage control map (see FIG. 4) stored in the storage unit. Therefore, the target input current Itg is calculated as a positive value when the state-of-charge difference ΔSOC is smaller than −C, and the target input current Itg is calculated as zero when the state-of-charge difference ΔSOC is larger than or equal to −C and smaller than or equal to C. When the state-of-charge difference ΔSOC is larger than C, the target input current Itg is calculated as a negative value. After the target input current Itg is calculated, the process of the electronic control unit 30 proceeds to step S25.

In step S25, the electronic control unit 30 calculates the amount of change ΔVout in the output voltage Vout of the DC-DC converter 23 based on the battery input current Ibat calculated in step S21 and the target input current Itg calculated in step S24. Specifically, the electronic control unit 30 subtracts the battery input current Ibat from the target input current Itg. The electronic control unit 30 calculates the amount of change ΔVout in the output voltage Vout by multiplying the subtracted value by a predetermined coefficient K. The coefficient K is determined based on an internal resistance, or the like, of the low-voltage battery 24, and is calculated in advance by testing, or the like. After calculation of the amount of change ΔVout, the process of the electronic control unit 30 proceeds to step S26.

In step S26, the electronic control unit 30 calculates a new target voltage Vn of the output voltage Vout of the DC-DC converter 23 by adding the amount of change ΔVout calculated in step S25 to the target voltage Vn−1 calculated in the last control cycle. In the first control cycle after the hybrid system is activated, the last target voltage Vn−1 is treated as a predetermined initial value (for example, the open circuit voltage of the low-voltage battery 24). The electronic control unit 30 outputs an operation signal MSdc commensurate with the calculated target voltage Vn to the DC-DC converter 23. After the electronic control unit 30 outputs the operation signal MSdc, one cycle of the charge-discharge control process by the electronic control unit 30 ends, and step S21 is executed again after a predetermined control period.

The operation and advantageous effects of the second embodiment will be described. Generally, the full charge capacity SOCmax of the low-voltage battery 24 in the hybrid system is property large such that various auxiliaries 25 are allowed to be driven over a certain period of time without electric power supplied from the DC-DC converter 23. Therefore, even when the low-voltage battery 24 is charged in the case where the state of charge SOC of the low-voltage battery 24 is lower than the target state of charge SOCtg, it takes several minutes to several tens of minutes until the state of charge SOC reaches the target state of charge SOCtg. For this reason, if the output voltage Vout of the DC-DC converter 23 is increased on the condition that the state of charge SOC is lower than the target state of charge SOCtg, the output voltage Vout may be excessively high at the time when the state of charge SOC has reached the target state of charge SOCtg. When the output voltage Vout of the DC-DC converter 23 at the time when the state of charge SOC has reached the target state of charge SOCtg is excessively high, unignorable hunting for the discharge voltage of the low-voltage battery 24 or the output voltage Vout of the DC-DC converter 23 easily occurs when the low-voltage battery 24 starts discharging electric power.

In contrast to this, in the second embodiment, the target input current Itg to the low-voltage battery 24 is calculated commensurately with the difference between the state of charge SOC of the low-voltage battery 24 and the target state of charge SOCtg. For example, as the state of charge SOC of the low-voltage battery 24 decreases relative to the target state of charge SOCtg, the target input current Itg to the low-voltage battery 24 is calculated as a larger value, so the rate of charge of the low-voltage battery 24 becomes faster. In this way, appropriate charge and discharge commensurate with the difference between the state of charge SOC of the low-voltage battery 24 and the target state of charge SOCtg is ensured.

In the meantime, the amount of change ΔVout in the output voltage Vout of the DC-DC converter 23 is calculated commensurately with the difference between the battery input current Ibat to the low-voltage battery 24 and the target input current Itg. When the output voltage Vout of the DC-DC converter 23 varies, the battery input current Ibat to the low-voltage battery 24 almost immediately keeps track of the output voltage Vout. For this reason, a continuous increase or continuous decrease in the output voltage Vout of the DC-DC converter 23 due to the long-term difference between the battery input current Ibat and the target input current Itg is avoided. As a result, when the state of charge SOC of the low-voltage battery 24 has reached the target state of charge SOCtg, an excessive increase or decrease in the output voltage Vout of the DC-DC converter 23 is avoided.

As shown in FIG. 4, within the range in which the state-of-charge difference ΔSOC is larger than or equal to −C and smaller than or equal to C, the battery input current Ibat to the low-voltage battery 24 is adjusted to zero (the target input current Itg is zero). That is, within the range in which the state-of-charge difference ΔSOC is larger than or equal to −C and smaller than or equal to C, the output voltage Vout of the DC-DC converter 23 is the voltage at which the low-voltage battery 24 is not charged or discharged, that is, the voltage that is not excessively high or excessively low. For this reason, for example, after that, even when discharge of the low-voltage battery 24 to the auxiliaries 25 is started as a result of an increase in load on the auxiliaries 25, a severe extent of voltage hunting resulting from an excessively high state of charge SOC of the low-voltage battery 24 at the start of discharge of the low-voltage battery 24 is prevented.

The embodiments may be modified as follows. The embodiments and the following alternative embodiments may be implemented in combination with each other if there is technically no conflict. In each of the embodiments, the electronic control unit 30 that generally controls the entire operation of the hybrid system executes a series of steps in the charge-discharge control process. For example, a controller that controls the engine 10 and a controller that executes the charge-discharge control process may be separate processing circuits (computers).

The value of the output voltage of the low-voltage battery 24 that is subjected to the charge-discharge control process of each of the embodiments does not matter. The output voltage of the low-voltage battery 24 does not always need to be lower than the output voltage of the high-voltage battery 22. The output voltage of the low-voltage battery 24 and the output voltage of the high-voltage battery 22 may be the same.

The type of the low-voltage battery 24 that is subjected to the charge-discharge control process of each of the embodiments is not limited to the examples of the embodiments. For example, a lithium ion battery, a nickel-metal hydride battery, a NAS battery, an all-solid battery, or the like, may be employed as the low-voltage battery 24. That is, the low-voltage battery 24 just needs to be a secondary battery that is repeatedly chargeable.

The charge-discharge control process of each of the embodiments may be applied to charge-discharge control over the high-voltage battery 22 instead of or in addition to charge-discharge control over the low-voltage battery 24. When the charge-discharge control process is applied to the high-voltage battery 22, the motor generator 20 may be regarded as an electric power supply device for the high-voltage battery 22. When the DC-DC converter 23 is a bidirectional converter that is able to step up and output the voltage of the low-voltage battery 24, the DC-DC converter 23 may also be regarded as an electric power supply device for the high-voltage battery 22.

The charge-discharge control process of each of the embodiments is not limited to application to charge-discharge control over a battery of a hybrid system. For example, the charge-discharge control process of each of the embodiments may be applied to a drive system as follows. In the drive system, the motor generator 20 and the high-voltage battery 22 are omitted, an alternator that generates electric power by using the driving force of the engine 10 is provided, and electric power is supplied from the alternator to the DC-DC converter 23 via the inverter 21. In the case of this alternative embodiment, the alternator does not assist the engine 10, and only the engine 10 operates as a driving source of the vehicle.

In each of the embodiments, the sensor unit 23a is incorporated in the DC-DC converter 23; however, the disposition of the sensor unit 23a is not limited thereto. For example, the sensor unit 23a may be connected to the wire between the DC-DC converter 23 and the low-voltage battery 24. This also applies to each of the sensor units of the high-voltage battery 22, low-voltage battery 24, and auxiliaries 25.

In the first embodiment, the amount of change ΔVout in the output voltage Vout of the DC-DC converter 23 varies with the input current Iacc to the auxiliaries 25 and the full charge capacity SOCmax of the low-voltage battery 24. Instead, the amount of change ΔVout may vary only with the full charge capacity SOCmax.

In the first embodiment, the first prescribed value A (−A in FIG. 2) and the second prescribed value A (+A in FIG. 2) in the voltage control map varies with the input current Iacc to the auxiliaries 25 and the full charge capacity SOCmax of the low-voltage battery 24. Instead, these values may be fixed values.

In the voltage control map (see FIG. 2) of the first embodiment, the amount of change ΔVout just needs to be a positive value when the state-of-charge difference ΔSOC is lower than −A, and, for example, the amount of change ΔVout may be a positive fixed value. Similarly, when the state-of-charge difference ΔSOC is higher than +A, the amount of change ΔVout may be a negative fixed value.

In the voltage control map (the solid line in FIG. 2) of the first embodiment, the first prescribed value and the second prescribed value each are A. Instead, the first prescribed value and the second prescribed value may be different values.

Figure 6:
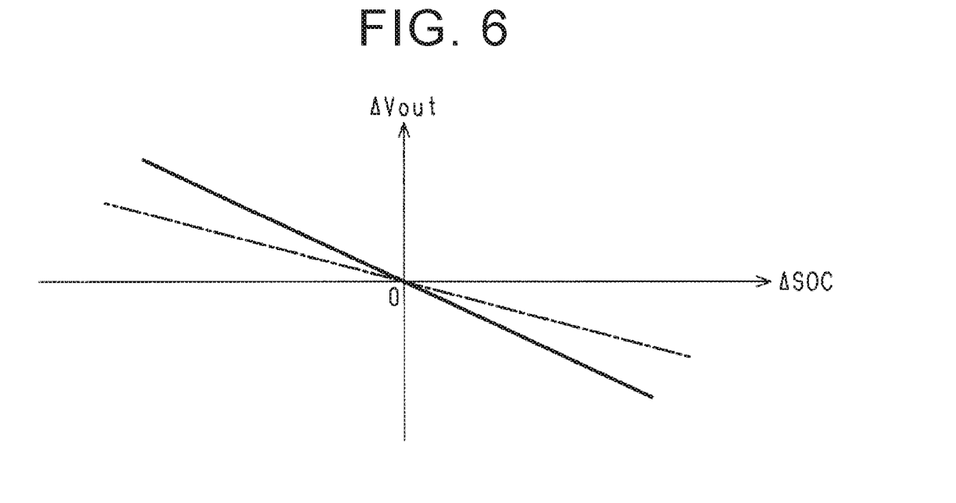
FIG. 6 is a graph that shows the relationship between an excess or shortage of a state of charge of a battery to a target state of charge of the battery and an amount of change in output voltage of a DC-DC converter in an alternative embodiment.

In the voltage control map of the first embodiment, the minimum value of each of the first prescribed value and the second prescribed value may be set to zero. In this case, as represented by the solid line in FIG. 6, the relationship between a state-of-charge difference ΔSOC and an amount of change ΔVout is a relationship that the origin at which the state-of-charge difference ΔSOC is zero and the amount of change ΔVout is zero is passed and the amount of change ΔVout reduces as the state-of-charge difference ΔSOC increases.

With regard to the above-described alternative embodiments, for example, when the output voltage Vout of the DC-DC converter 23 at the time when the state of charge SOC of the low-voltage battery 24 has reached the target state of charge SOCtg is desired to fall within an appropriate range, the first prescribed value and the second prescribed value each are desirably a large value. In the meantime, if the first prescribed value and the second prescribed value each are a large value, there are increased situations in which the output voltage Vout of the DC-DC converter 23 does not vary with the state-of-charge difference ΔSOC, so a period of time that is taken until the state of charge SOC of the low-voltage battery 24 reaches the target state of charge SOCtg may extend. In terms of this point, in the first embodiment, since the extent of hunting for the output voltage Vout of the DC-DC converter 23 is appropriately reduced, there is a high probability that the output voltage Vout of the DC-DC converter 23 falls within an appropriate range. Therefore, in terms of quickly adjusting the state of charge SOC of the low-voltage battery 24 to the target state of charge SOCtg while reducing excessive hunting, it is preferable that a configuration that sets the minimum value of each of the first prescribed value and the second prescribed value to zero is employed on the assumption of the charge-discharge control process of the first embodiment.

The first prescribed value and the second prescribed value each may be fixed at zero. In this case, as represented by the alternate long and short dashes line in FIG. 6, only the rate of change (the slope of the line) in the amount of change ΔVout to the state-of-charge difference ΔSOC in the voltage control map varies with the input current Iacc to the auxiliaries 25 and the full charge capacity SOCmax of the low-voltage battery 24.

In the first embodiment, the amount of change ΔVout in the output voltage Vout of the DC-DC converter 23 is calculated by using the coefficient α1, the coefficient α2, the coefficient β1, and the coefficient β2; however, calculation of the amount of change ΔVout is not limited thereto. For example, a charge-discharge control map may be prepared for each of the different full charge capacities SOCmax and each of the different input currents Iacc, and the amount of change ΔVout may be calculated based on the map of which the closest full charge capacity SOCmax and the closest input current Iacc among the plurality of charge-discharge control maps.

The order of the steps of the charge-discharge control process in the first embodiment is illustrative, and may be modified as needed. When parameters required to calculate the amount of change ΔVout have been calculated in step S16, the order of the processes of step S11 to step S15 does not matter, and part of the steps may be processed in parallel. This also applies to the charge-discharge control process in the second embodiment, and parameters required to calculate the amount of change ΔVout just needs to be calculated in step S25.

In the voltage control map of the second embodiment, the relationship between a state-of-charge difference ΔSOC and a target input current Itg may be linear. That is, the first prescribed value and the second prescribed value each may be zero. In addition, the first prescribed value and the second prescribed value each may vary commensurately with, for example, the full charge capacity SOCmax of the low-voltage battery 24 or the input current Iacc to the auxiliaries 25 or both.

What is claimed is:

1. A charge-discharge control system that is applied to a vehicle including a battery and an electric power supply device, the battery being configured to supply electric power to an electrically-powered device, the electric power supply device being configured to supply electric power to the battery and the electrically-powered device, the charge-discharge control system being configured to adjust an amount of electric power charged to or discharged from the battery, the charge-discharge control system comprising an electronic control unit configured to:
calculate a full charge capacity of the battery;
calculate an excess or shortage of a state of charge of the battery to a target state of charge of the state of charge as a state-of-charge difference,
increase an output voltage of the electric power supply device when the shortage of the state of charge is larger than a first prescribed value based on the state-of-charge difference, and decrease the output voltage of the electric power supply device when the excess of the state of charge is larger than a second prescribed value based on the state-of-charge difference, and
calculate an amount of change in the output voltage of the electric power supply device per unit time such that the amount of change in the output voltage of the electric power supply device per unit time is smaller when the full charge capacity is low than when the full charge capacity is high.

2. The charge-discharge control system according to claim 1, wherein:
the electronic control unit is configured to, when the shortage of the state of charge is smaller than or equal to the first prescribed value or when the excess of the state of charge is smaller than or equal to the second prescribed value, set the amount of change in the output voltage of the electric power supply device per unit time to zero; and
the electronic control unit is configured to calculate at least one of the first prescribed value and the second prescribed value such that the at least one of the first prescribed value and the second prescribed value is larger when the full charge capacity is low than when the full charge capacity is high.

3. The charge-discharge control system according to claim 1, wherein the electronic control unit is configured to calculate the amount of change in the output voltage of the electric power supply device per unit time such that the amount of change in the output voltage of the electric power supply device per unit time is smaller when an input current to the electrically-powered device is low than when the input current to the electrically-powered device is high.

4. The charge-discharge control system according to claim 3, wherein:
the electronic control unit is configured to, when the shortage of the state of charge is smaller than or equal to the first prescribed value or when the excess of the state of charge is smaller than or equal to the second prescribed value, set the amount of change in the output voltage of the electric power supply device per unit time to zero; and
the electronic control unit is configured to calculate at least one of the first prescribed value and the second prescribed value such that the at least one of the first prescribed value and the second prescribed value is larger when the input current to the electrically-powered device is low than when the input current to the electrically-powered device is high.

5. The charge-discharge control system according to claim 1, wherein a minimum value of each of the first prescribed value and the second prescribed value is zero.

6. A charge-discharge control system that is applied to a vehicle including a battery and an electric power supply device, the battery being configured to supply electric power to an electrically-powered device, the electric power supply device being configured to supply electric power to the battery and the electrically-powered device, the charge-discharge control system being configured to adjust an amount of electric power charged to or discharged from the battery, the charge-discharge control system comprising an electronic control unit configured to calculate an excess or shortage of a state of charge of the battery to a target state of charge of the state of charge as a state-of-charge difference, set a target input current of an input current to the battery based on the state-of-charge difference, adjust an output voltage of the electric power supply device based on the input current to the battery and the target input current, set the target input current to a positive value when the shortage of the state of charge is larger than a first prescribed value, set the target input current to a negative value when the excess of the state of charge is larger than a second prescribed value, and calculate an amount of change in the output voltage of the electric power supply device per unit time such that the amount of change in the output voltage of the electric power supply device per unit time is smaller when a difference between the input current to the battery and the target input current is small than when the difference between the input current to the battery and the target input current is large.

\* \* \* \* \*